United States Patent
Denison et al.

(10) Patent No.: US 10,128,219 B2
(45) Date of Patent: *Nov. 13, 2018

(54) MULTI-CHIP MODULE INCLUDING STACKED POWER DEVICES WITH METAL CLIP

(71) Applicant: Texas Instruments Incorporated, Dallas, TX (US)

(72) Inventors: Marie Denison, Plano, TX (US); Richard Saye, Greenville, TX (US); Takahiko Kudoh, Beppu (JP); Satyendra Singh Chauhan, Sugar Land, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 271 days.

This patent is subject to a terminal disclaimer.

(21) Appl. No.: 13/870,770

(22) Filed: Apr. 25, 2013

(65) Prior Publication Data

US 2013/0285260 A1    Oct. 31, 2013

Related U.S. Application Data

(60) Provisional application No. 61/638,037, filed on Apr. 25, 2012.

(51) Int. Cl.
*H01L 25/07* (2006.01)
*H01L 23/495* (2006.01)
*H01L 23/31* (2006.01)

(52) U.S. Cl.
CPC .......... *H01L 25/07* (2013.01); *H01L 23/4952* (2013.01); *H01L 23/49524* (2013.01);
(Continued)

(58) Field of Classification Search
CPC ....... H01L 25/0657; H01L 2224/32145; H01L 2225/06582
(Continued)

(56) References Cited

U.S. PATENT DOCUMENTS

| 4,996,587 A | 2/1991 | Hinrichsmeyer et al. |
| 6,869,826 B2 | 3/2005 | Wark |

(Continued)

OTHER PUBLICATIONS

Mary Jean Ramos, et al., "The Method of Making Low-Cost Multiple-Row QFN", Electronic Manufacturing Technology Symposium, 2007, IEMT '07, 32nd IEEE/CPMT International, Oct. 3-5, 2007, pp. 261-267.

(Continued)

*Primary Examiner* — Lex Malsawma
*Assistant Examiner* — Geoffrey Ida
(74) *Attorney, Agent, or Firm* — Ronald O. Neerings; Charles A. Brill; Frank D. Cimino

(57) ABSTRACT

A Multi-Chip Module (MCM) package includes a substrate having a plurality of metal terminals and at least a first die attach area. An encapsulant is around the substrate including on at least a portion of the topside and at least a portion of the bottomside of the package. At least a first device including at least two device terminals is attached face up on the first die attach area. At least a second device including at least two device terminals is flip-chip attached and stacked on the first device. At least one of the first device and second device include a transistor. At least one metal clip is between the first device and second device including a plurality of clip portions isolated from one another connecting at least one device terminal of each of the first device and second device to respective metal terminals of the plurality of metal terminals.

13 Claims, 5 Drawing Sheets

(52) U.S. Cl.
CPC .. *H01L 23/49541* (2013.01); *H01L 23/49548* (2013.01); *H01L 23/49575* (2013.01); *H01L 25/074* (2013.01); *H01L 23/3107* (2013.01); *H01L 2224/49171* (2013.01); *H01L 2924/1301* (2013.01); *H01L 2924/1305* (2013.01); *H01L 2924/13034* (2013.01); *H01L 2924/13055* (2013.01); *H01L 2924/13062* (2013.01); *H01L 2924/13091* (2013.01); *H01L 2924/1461* (2013.01)

(58) Field of Classification Search
USPC .......................................................... 257/777
See application file for complete search history.

(56) References Cited

U.S. PATENT DOCUMENTS

| | | |
|---|---|---|
| 7,271,477 B2 | 9/2007 | Saito et al. |
| 7,291,869 B2 | 11/2007 | Otremba |
| 7,569,920 B2 | 8/2009 | Otremba et al. |
| 7,626,262 B2 | 12/2009 | Otremba et al. |
| 7,663,217 B2 | 2/2010 | Kim et al. |
| 7,732,929 B2 | 6/2010 | Otremba et al. |
| 7,800,208 B2 | 9/2010 | Otremba |
| 7,821,128 B2 | 10/2010 | Ewe et al. |
| 7,936,054 B2 | 5/2011 | Eom et al. |
| 8,461,669 B2 | 6/2013 | Yang et al. |
| 2005/0104222 A1* | 5/2005 | Jeong ..................... H01L 23/16 257/778 |
| 2005/0161793 A1 | 7/2005 | Ohno et al. |
| 2005/0224945 A1* | 10/2005 | Saito et al. .................. 257/686 |
| 2005/0263311 A1* | 12/2005 | Tsai et al. ..................... 174/52.2 |
| 2005/0280163 A1* | 12/2005 | Schaffer .............. H01L 23/5385 257/778 |
| 2007/0007639 A1 | 1/2007 | Fukazawa |
| 2007/0040260 A1* | 2/2007 | Otremba ................. H01L 24/40 257/686 |
| 2007/0200537 A1 | 8/2007 | Akiyama et al. |
| 2008/0024102 A1 | 1/2008 | Hebert et al. |
| 2008/0036070 A1* | 2/2008 | Anderson ......... H01L 23/49562 257/696 |
| 2008/0067642 A1* | 3/2008 | Koon ................... H01L 23/3107 257/666 |
| 2008/0122063 A1 | 5/2008 | Akiba |
| 2008/0135990 A1 | 6/2008 | Coyle et al. |
| 2008/0230876 A1 | 9/2008 | Camacho et al. |
| 2009/0014857 A1 | 1/2009 | Hufgard |
| 2009/0261462 A1 | 10/2009 | Gomez |
| 2010/0015583 A1 | 1/2010 | Leuthardt et al. |
| 2010/0090668 A1 | 4/2010 | Girdhar et al. |
| 2010/0155836 A1 | 6/2010 | Hebert |
| 2010/0155915 A1 | 6/2010 | Bell et al. |
| 2011/0037170 A1* | 2/2011 | Shinohara ............. H01L 21/561 257/737 |
| 2011/0227207 A1* | 9/2011 | Yilmaz et al. ................. 257/676 |
| 2011/0298114 A1 | 12/2011 | Pruitt |
| 2012/0193772 A1 | 8/2012 | Jiang |
| 2012/0228696 A1* | 9/2012 | Carpenter et al. ............. 257/329 |

OTHER PUBLICATIONS

Z. J. Shen, et al., "Lateral Discrete Power MOSFET: Enabling Technology for Next-Generation, MHz-Frequency, High-Density DC/DC Converters", Applied Power Electronics Conference and Exposition, 2004, APEC '04, Nineteenth Annual IEEE, vol. 1, pp. 225-229.

Aram Arzumanyan, et al., "Flip Chip Power MOSFET: A New Wafer Scale Packaging Technique", Power Semiconductor Devices and ICs, 2001, ISPSD '01, Proceedings of the 13th International Symposium on Power Semiconductor Devices and ICs, pp. 251-254.

* cited by examiner

MULTI-CHIP MODULE INCLUDING STACKED POWER DEVICES WITH METAL CLIP

CROSS REFERENCE TO RELATED APPLICATIONS

This application claims the benefit of Provisional Application Ser. No. 61/638,037 entitled "MULTI-CHIP MODULE DESIGN COMPRISING FLIP-CHIP POWER DEVICES AND WIREBONDED IC", filed Apr. 25, 2012, which is herein incorporated by reference in its entirety.

FIELD

Disclosed embodiments relate to Multi-Chip Module (MCM) packages including a substrate and a plurality of stacked power devices including at least one power transistor.

BACKGROUND

Demand for semiconductor devices for lower-cost, higher performance, increased miniaturization and greater packaging densities have lead to MCM structures. MCM structures include two or more die and optionally other semiconductor components mounted within a single semiconductor package. The number of dies and other components can be mounted in a vertical manner, a lateral manner, or a combination of a vertical and lateral manner.

One arrangement of first and second power MOSFETs (hereafter a "power FET") is implemented as stacked lateral power FETs. Stacked lateral power FETs are conventionally assembled by placing one leadframe matrix subassembly having one power FET soldered thereto on top of another leadframe matrix subassembly having another power FET soldered thereto. Challenges in such assembly include reducing the movement between the two subassemblies prior to reflowing the solder and insuring flatness between the two subassemblies to provide good interconnection all at once during solder reflow.

SUMMARY

Disclosed embodiments include Multi-Chip Module (MCM) packages having a substrate and stacked first and second devices (chips) which provide at least one power transistor such as a power field effect transistor (FET). A metal clip is between the first and second devices. The top device is flip-chip assembled and the bottom device is assembled face up. The substrate can comprise a leadframe or other substrate such as an organic substrate. In the case of a leadframe, the leadframe can be a single leadframe. By using a single leadframe and metal clip(s), disclosed MCM packages overcome the above described assembly challenges including reducing the movement between the two subassemblies prior to reflowing the solder and insuring flatness between the two subassemblies to make good interconnection all at once during solder reflow.

The substrate has a plurality of metal terminals and at least a first die attach area. An encapsulant is around the substrate including on at least a portion of a topside and at least a portion of a bottomside of the package. The first and second device include at least two device terminals. The first device is attached face up on the first die attach area. The second device is flip-chip attached and stacked on the first device. At least one metal clip is between the first device and second device including a plurality of clip portions isolated from one another connecting at least one device terminal of each of the first device and second device to respective metal terminals of the plurality of metal terminals. The first and second devices are generally soldered to the substrate or the metal clip. As used herein, unless indicate otherwise, "connecting" refers to electrically connecting and can include direct connections, or indirect connects such as solder mediated connections.

In one embodiment the first and second devices are both lateral power FETs, where the first lateral FET is attached face up on the first die attach area. At least a second lateral power FET is flip-chip attached and is stacked on the first lateral power FET.

Disclosed MCM packages can also include an optional controller or driver die or a controller/driver die, hereafter referred to as a "controller die", such as together with first and second lateral power FETs. The controller die can either be incorporated into MCM assembly or be separate and added as secondary component. The incorporation into assembly as part of the MCM can be via wire bonding or by solder balls via flip-chip placement. The routing can be done via routing within substrate and solder ball interconnect, or by wire bonded into assembly. For example, the controller die can be connected to metal terminals of a leadframe or organic substrate by bond wires, where first and second gate driver nodes on the controller die can connect to first and second metal terminals of the substrate, and the respective gates of the lateral power FET can be connected to the first and second metal terminals of the substrate by portions of the metal clip.

A significant advantage of disclosed MCM packages including an optional controller die is low parasitic connections (resistance, capacitance, and inductance) between the gate driver nodes on the controller die and the gates or control nodes of the power devices. Other significant advantages include cost reduction via ease of assembly, since assembly can be analogous to mounting and reflowing a double sided printed circuit board (PCB).

BRIEF DESCRIPTION OF THE DRAWINGS

Reference will now be made to the accompanying drawings, which are not necessarily drawn to scale, wherein:

FIG. 3A is a cross sectional depiction of a double partial-etch metal clip with wafer level soldering for the lateral power FETs over their common OUT terminal, while

FIG. 3C is a cross sectional depiction of a double partial-etch metal clip/leadframe on thick copper (Cu) rods with patterned wafer level soldering over their common OUT terminal, while

FIG. 3E is a cross sectional depiction of a first (top) metal clip and a second metal clip (bottom) having different heights, with the first metal clip supported at locations of the OUT node where the 2 lateral power FETs are to be shorted together, while

DETAILED DESCRIPTION

Figure 1A:
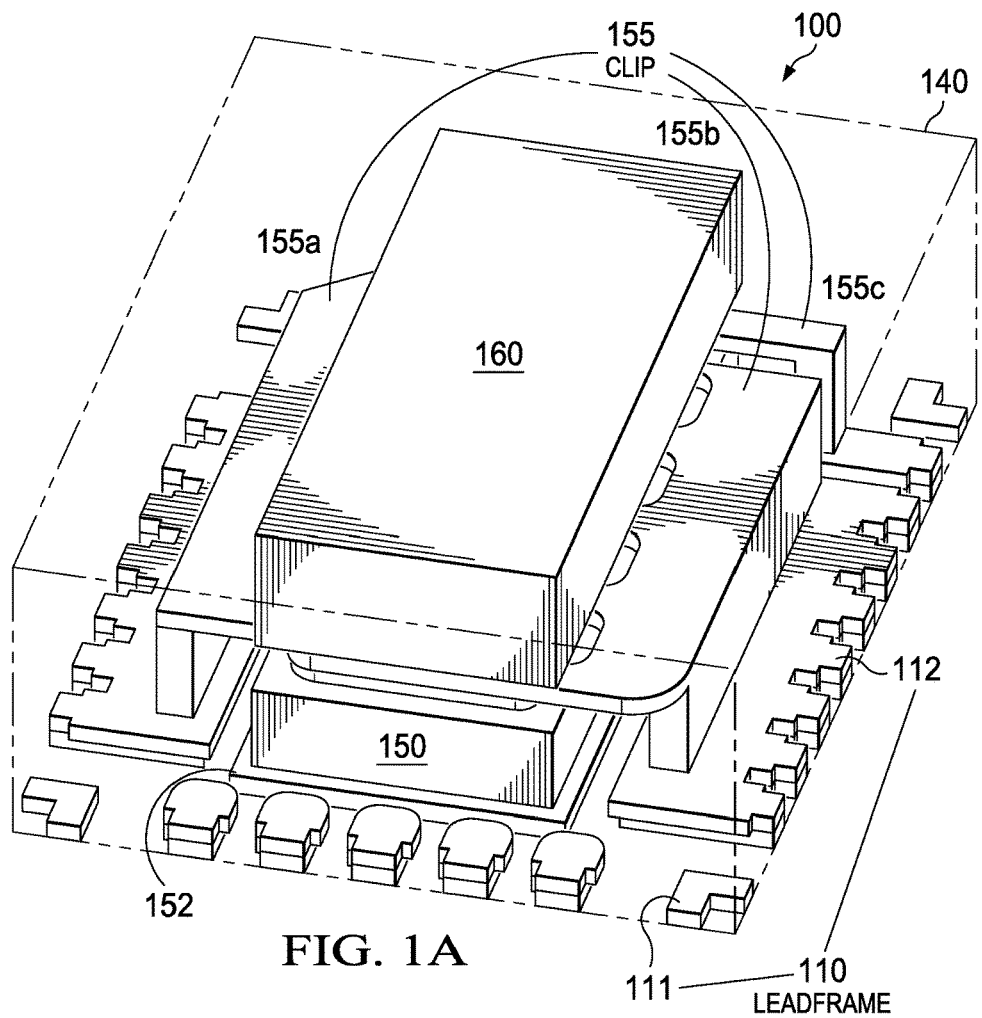
FIG. 1A is a simplified perspective view depiction of an example MCM package including first and second stacked devices both soldered to a metal clip therebetween, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1B:
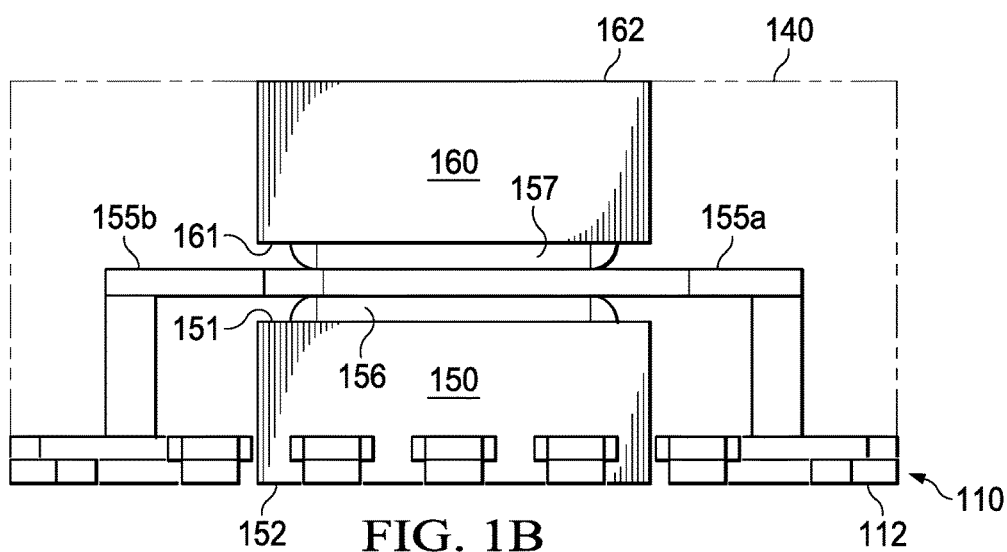
FIG. 1B is a cross sectional depiction another example MCM package including first and second stacked devices with an exposed bottom device, according to an example embodiment.

FIG. 1A is a simplified perspective view depiction of an example MCM package 100 including first and second power devices (chips) 150, 160 each having at least two device terminals both soldered to a metal clip 155 there between, according to an example embodiment. An optional metal (e.g. copper) slug 152 is shown under the first power device 150. FIG. 1B is a related cross sectional depiction to the example MCM package 100 shown in FIG. 1A with an exposed die (no metal slug under first power device 150). Solder may be replaced by other electrically conductive materials suitable for bonding semiconductor devices.

The first and second power device collectively include at least one transistor, and can include combinations of diodes (e.g., Shottky diode) and transistors, or first and second transistors. Transistors can include bipolars including thyristors (pair of tightly coupled bipolar junction transistors also called silicon controlled rectifiers), FETs including junction gate field-effect transistors (JFETs), and metal-oxide-semiconductor field-effect transistors (MOSFETs) including double-diffused metal-oxide-semiconductor (DMOS), High-electron-mobility transistors (HEMTs, such as a GaN HEMT), as well as Insulated Gate Bipolar Transistors (IGBTs). Each chip/die in the stack can include two or more discrete devices, such as the first power device die having two or more power transistors.

As shown in FIG. 1B, the first power device 150 has an active topside 151 and a bottomside 152 which is assembled with its topside 151 to clip portion 155b soldered with solder 156, while the second power device 160 has an active top side 161 and a bottomside 162 that is flip-chip assembled with its topside 161 assembled with solder 157 to clip portion 155a. The metal clip 155 can be manufactured from copper (or other suitable metal) to provide low electrical and thermal resistance. Clip portions 155a and 155b each have a plurality of fingers, and these fingers are typically inter-digitated.

In one embodiment the first and second power devices 150, 160 both comprise lateral power FETs, which can comprise p-channel or n-channel FETs. In one specific embodiment, the lateral power FETs both comprise gallium nitride (GaN) transistors having solder bars or solder bumps on their terminals. The lateral power FETs can also comprise SiC-based FETs in another specific embodiment.

MCM package 100 includes a substrate 110 shown as a single leadframe having a plurality of metal terminals including single terminals 111 and extended terminals 112, and at least a first die attach area for accommodating the first power device 150 which is the bottom device in MCM package 100. Although substrate 110 is shown as a leadframe 110, substrate can be a variety of other package substrates including an organic substrate (e.g., glass-reinforced epoxy laminates such as FR4). Substrate 110 embodied as a leadframe can be a leaded leadframe (e.g., gull wing or a leadless leadframe such as quad-flat no-leads (QFN) or dual-flat no-leads (DFN). For disclosed embodiments including a controller die, the exposed die pad provided by QFNs allows decoupling of the controller die thermally from the lateral power FET devices that can each drive few Watts of power and be subject to significant self-heating. Although not shown, selective plating on the leadframe may be used to enable both wire bonding (e.g., a controller die) and flip-chip bonding (e.g., bottom lateral power FET) on same leadframe surface.

Encapsulant (e.g., an epoxy) 140 is around the substrate 110 including on at least a portion of a topside of the MCM package 100 and at least a portion of a bottomside of the MCM package 100. The first power device 150 is positioned in the first die attach area. Exposed package features on the bottomside 152 of the MCM package 100 from the encapsulant 140 can provide low electrical and thermal resistance connections to a board. The bottomside 152 of the first power device 150 is exposed from the MCM package 100 to allow use as an electrical ground or thermal gateway to provide a low thermal resistance connection to a package substrate, such as a printed circuit board (PCB). Similarly, the bottomside 162 of the second power device 160 is exposed from the topside of the MCM package 100 to allow attachment to a heat sink, such as using a copper slug between.

Figure 2A:
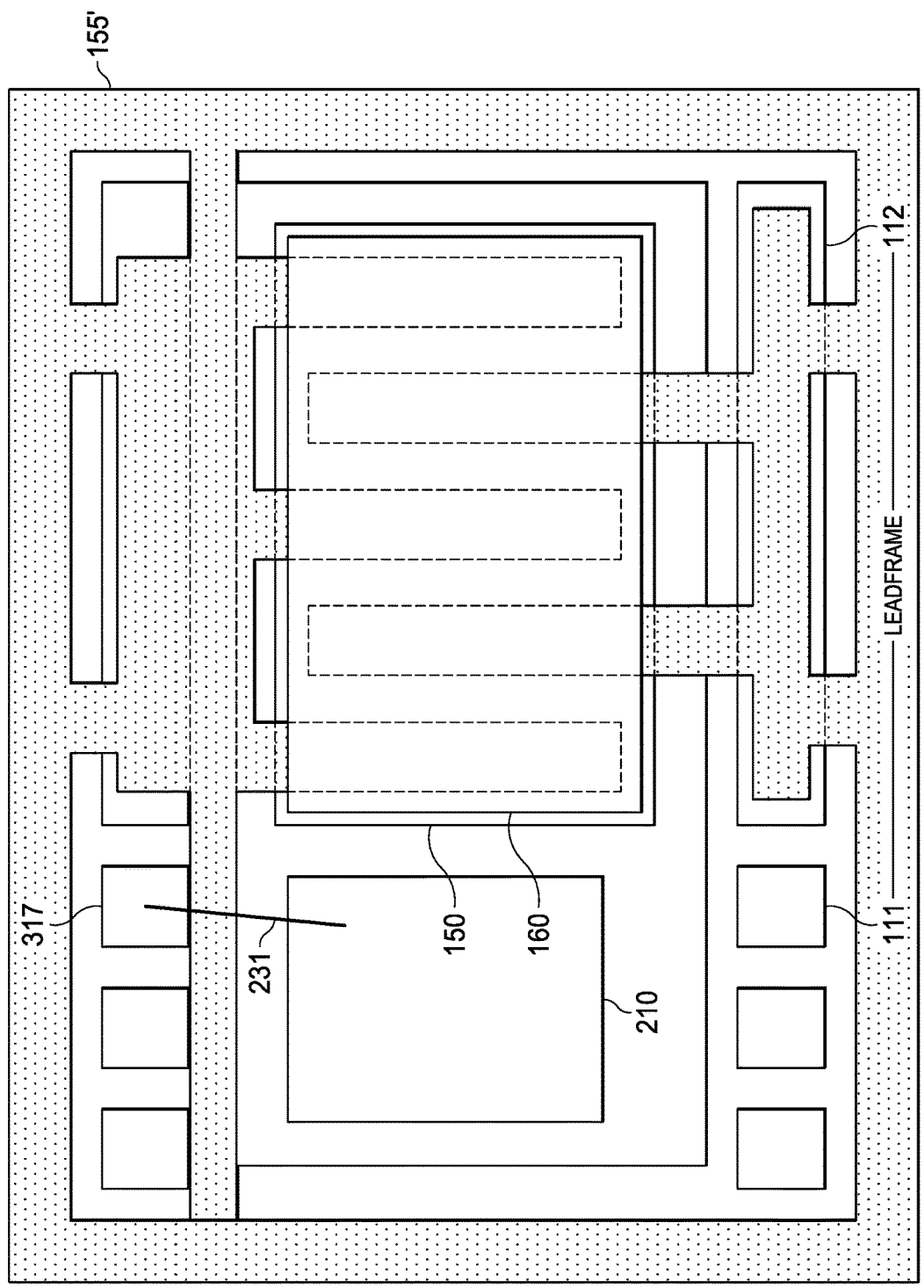
FIG. 2A is a depiction of an example MCM package precursor (partially assembled) including stacked lateral power FETs with a gang metal clip therebetween and an optional controller die connected to the stacked lateral power FETs positioned next to the stacked lateral power FETs, according to an example embodiment.

FIG. 2A is a depiction of an example MCM package precursor (partially assembled) including stacked power devices 150, 160 described as being lateral power FETs with a gang metal clip 155' therebetween and an optional controller die 210 connected to the stacked lateral power FETs positioned next to the stacked lateral power FETs, according to an example embodiment. Only one bond wire 231 of several bond wires which will generally be used in the assembly used are shown. The gang metal clip 155' will be subsequently cut to provide electrically isolated clip portions including the clip portions shown in FIGS. 1A and 1B.

Wirebonding as shown for the controller die 210 allows accommodating large pin count controller die. Although the controller die 210 is shown mounted face up and is connected to the metal terminal 317 of the substrate 110 by a bondwire 231, the controller die 210 may also be flip-chip assembled onto the substrate 110.

Figures 2B, 2C:
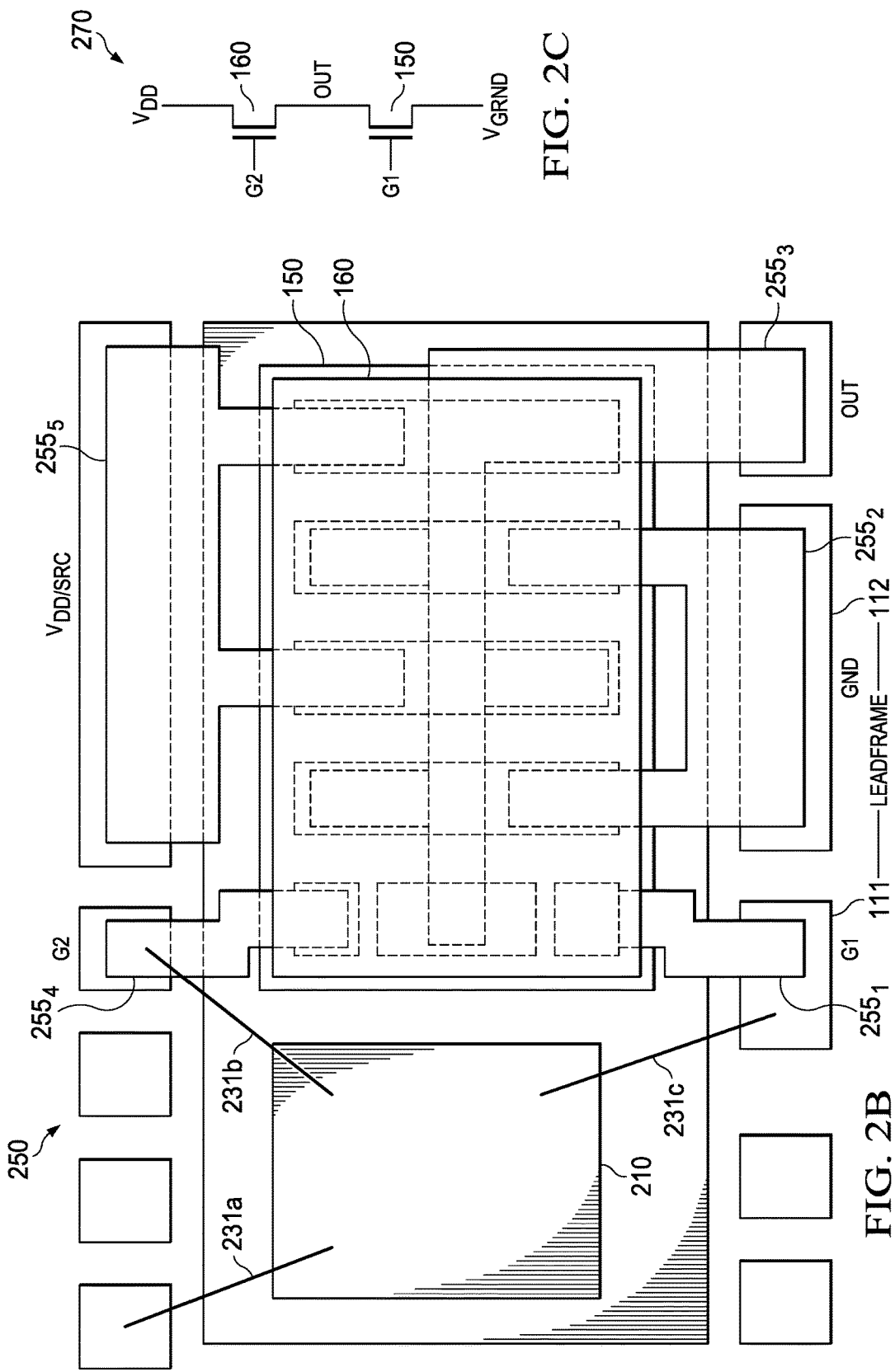
FIG. 2B is an x-ray depiction of an example MCM package including stacked lateral power FETs with a metal clip therebetween and an optional controller die connected to the stacked lateral power FETs positioned next to the stacked lateral power FETs, according to an example embodiment.
FIG. 2C is a circuit schematic showing the 5 terminal multi-chip power device implemented by the MCM package.

FIG. 2B is an x-ray depiction (to remove encapsulant from the depiction) of an example MCM package 250 including stacked power devices 150, 160 described as stacked lateral power FETs with a metal clip including clip portions $255_1$, $255_2$, $255_3$, $255_4$ and $255_5$ therebetween and an optional controller die 210 connected to the stacked lateral power FETs positioned next to the stacked lateral power FETs, according to an example embodiment. FIG. 2C is a circuit schematic showing the stacked FETs interconnected as a 5 terminal power device 270 in a series configuration, which can also be configured to have the respective FETs to be in parallel, or configured to provide bi-directional performance. Power device 270 implemented by MCM package 250 as shown includes a Vdd/Source terminal, a gate 2 (G2) terminal, and an OUT terminal (common with first the first power device 150 embodied as a lateral power FET) for stacked power device 160 (embodied as a lateral power FET), a gate 1 (G1) terminal, and a ground (Vgrnd) terminal for the first power device 150.

The electrically isolated clip portions shown as $255_1$, $255_2$, $255_3$, $255_4$ and $255_5$ are for separately connecting to each of the 5 terminals of the 5 terminal power device 270. Bondwires 231*a*, 231*b* and 231*c* are shown connecting nodes on the controller die 210 to respective metal terminals of the substrate 110. Bondwire 231*a* connects to a metal terminal that in operation of the power device 270 receives a control input (e.g., from a control circuit), while bondwires 231*b* and 231*c* to connect to metal terminals of the substrate 110 that are connected to the G terminals (G1 and G2) of the first and second power devices 150 and 160 by clip portions $255_1$ and $255_4$, respectively. Although not shown in FIG. 2B, bondwires such as bondwire 231*c* can connect directly to clip portion $255_1$. The connections to the G terminals being inside of the package outline close to the controller die 210 maintains a relatively short wirebond length to provide low electrical parasitics that lead to high speed power MCM performance.

There are a variety of assembly options with the option to also utilize different metal clip arrangements. FETs can be attached to terminals in single pass, either by preassembly, or by a one pass assembly operation where all the FETs are stacked uncured and then reflowed. FIGS. 3A-F describe the first power device 150 and second power device 160 as both being lateral power FETs.

Figure 3A:
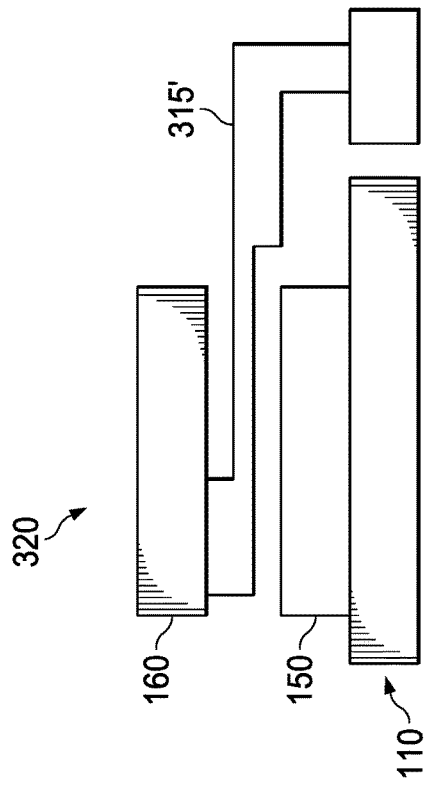
Figure 3B:
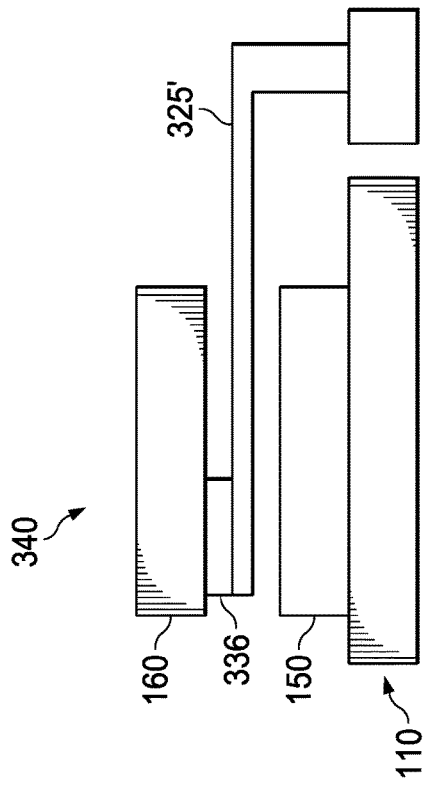
FIG. 3B is a cross sectional depiction showing a double partial-etch metal clip with wafer level soldering for the lateral power FETs over isolated bottom terminals.

Regarding metal clip options, for example, FIG. 3A is a cross sectional depiction 310 of a double partial (e.g., half)-etch metal clip 315 with wafer level soldering for the common OUT terminal of the first and second power device 150, 160 being lateral power FETs, while FIG. 3B is a cross sectional depiction 320 showing a double partial (e.g., half) etch metal clip 315' with wafer level soldering for the lateral power FETs over electrically isolated bottom terminals. In these embodiments, the substrate terminals can be pre-etched to include the terminal areas.

Figure 3C:
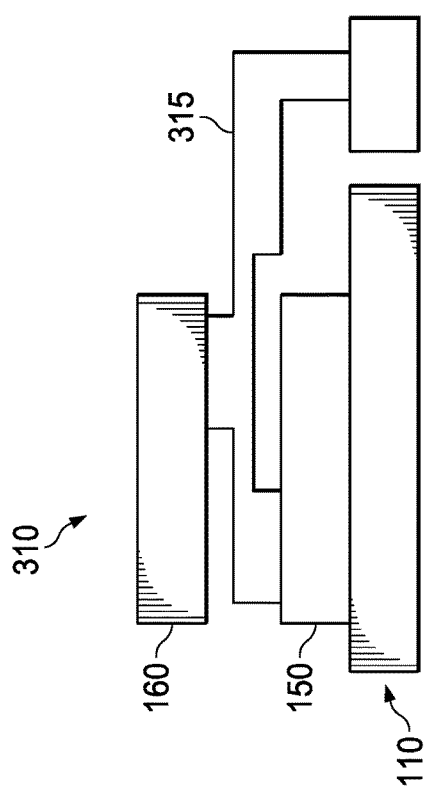
Figure 3D:
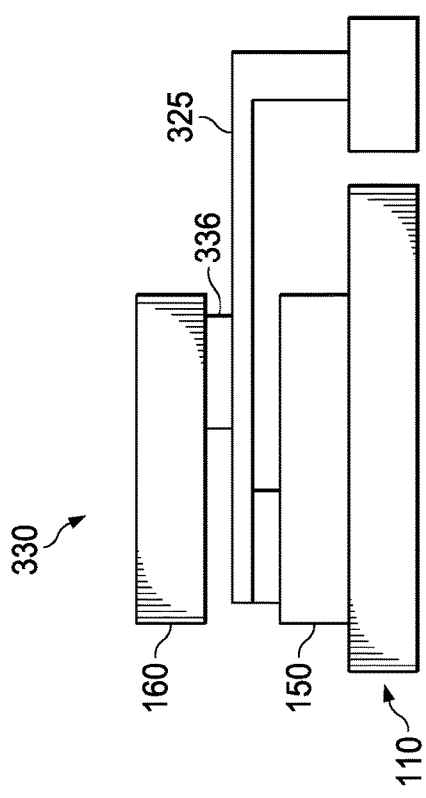
FIG. 3D is a cross sectional depiction showing a double partial-etch metal clip/leadframe on thick Cu rods with wafer level soldering for the lateral power FETs over isolated bottom terminals.

FIG. 3C is a cross sectional depiction 330 of a double partial (e.g., half)-etch metal clip 325/substrate 110 on thick Cu rods 336 with patterned wafer level soldering over the common OUT terminal the first and second power device 150, 160 embodied as lateral power FETs, while FIG. 3D is a cross sectional depiction 340 showing a double partial (e.g., half)-etch metal clip 325'/substrate 110 on thick Cu rods 336 with wafer level soldering for the lateral power FETs over isolated bottom terminals.

Figure 3E:
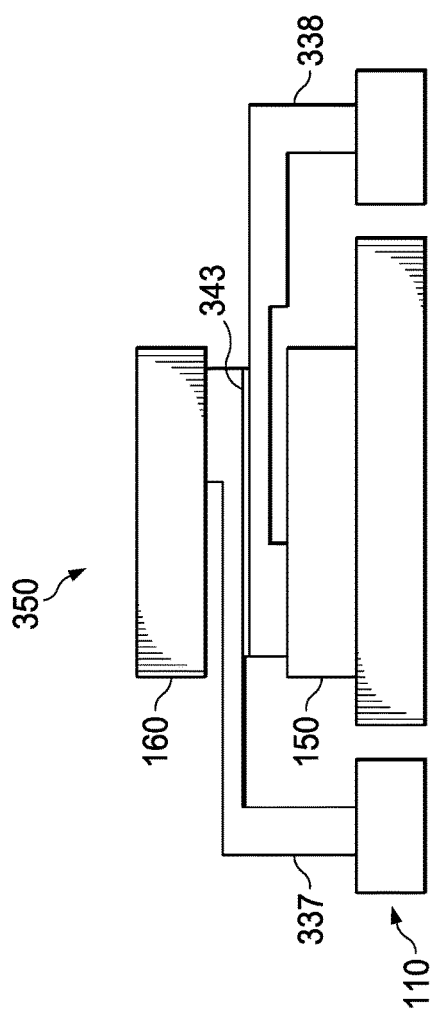
Figure 3F:
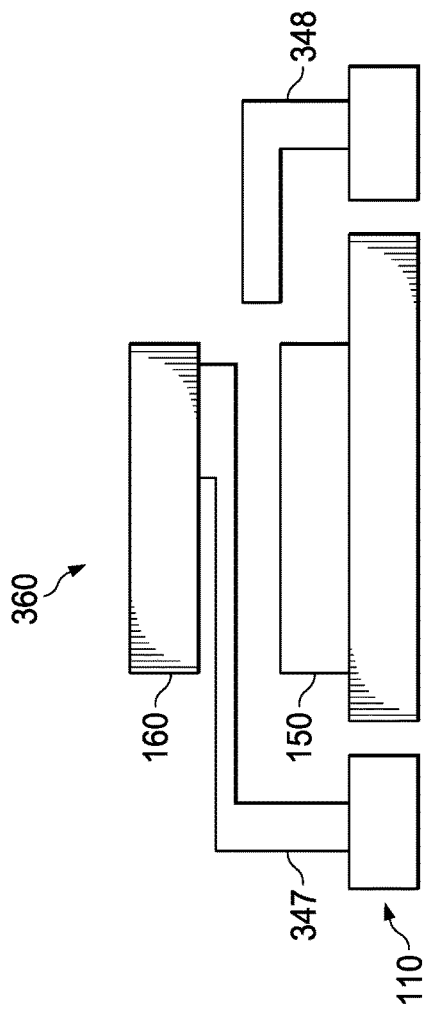
FIG. 3F is a cross sectional depiction of a first (top) metal clip and a second (bottom) metal clip having different heights contacting isolated terminals.

Another example metal clip option is two metal clips having different heights, with the top clip supported at locations of the common OUT node where the first and second power device 150, 160 embodied as 2 lateral power FETs are to be shorted together. FIG. 3E is a cross sectional depiction 350 of a first (top) metal clip 337 and a second metal clip 338 having different heights, with the first (top) metal clip 337 mechanically supported at locations of the OUT node where the 2 lateral power FETs are to be shorted together. The respective clips 337 and 338 overlap one another over the OUT node. An electrically conducting material such as solder or silver filled epoxy 343 is shown between the metal clips 337, 338. FIG. 3F is a cross sectional depiction 360 of a first (top) metal clip 347 and a second (bottom) metal clip 348 having different heights contacting isolated terminals.

Assembly options include, but are not limited to, controller die backside metallization for solder die attach, die attach using epoxy type of materials, green/non-green mount compound materials, and reflow profiles. As noted above, when included, the controller die may be solder die attached with same reflow process as lateral power FETs. Solder screen printing can be used to control power FET stand-off to the substrate and mold filling. Different finishes can be used including bare Cu or plated leadframes such as CuNiPd with Ag plating. Different finishes may be provided under the controller, FET soldered areas, fused pins and wirebonded areas. Bondwires, such as Al, Cu, Au wirebonds may be used having different diameters (e.g., 1 and 2 mil). The lateral power FETs may be assembled from tape and reel or by pick and place from singulated wafers.

In further embodiments, any number of FETs and controller devices and various relative lateral arrangements thereof, driving different package sizes and geometries, and integration of several FETs within one single die (lateral isolation between the FETs realized by die technology). Two or more lateral power FETs can be on each level of the MCM package. Metal clips can be connected to the backside of the power FETs with highly thermally conducting and electrically isolating or electrically conducting attach materials (allowing different clip layouts), with FET backside metallization, with mechanical/thermal/and-or electrical connection to all or some of the LF fused power pins with exposure to the package top side (DUAL COOL™ technology applied to lateral FET backsides).

Metal clips can be between the FETs and/or over the top FET layer (using electrically conducting or non-conducting attach materials depending on configuration). Face down top FETs can be over patterned clips, with thermally conducting/electrically isolating clip attach material at the interface to the bottom FET layer as needed. Passive components such as capacitors, resistors and inductors may also be added within the package. In addition, other active dies may be included such as an enhancement power FET component to control a depletion power GaN FET assembly.

Significant advantages of disclosed embodiments include low parasitic connections (resistance, capacitance, and inductance) between the gate driver nodes on the controller die and the gates of the power FETs, with the possibility to include high pin count controllers through wirebonding or flip-chip. Other significant advantages include cost reduction via ease of assembly. Assembly is similar to mounting and reflowing a double sided PCB.

Disclosed embodiments can be integrated into a variety of assembly flows to form a variety of different semiconductor integrated circuit (IC) devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A multi-chip module comprising:
   (a) a substrate;
   (b) a first power device having a bottom side mounted on the substrate and having an active top side;
   (c) a second power device having an active top side arranged facing the active side of the first power device and having a bottom side arranged away from the first clip portion;
   (d) a first clip portion having plural fingers arranged between the first and second power devices and being electrically connected to the active top side of only the first power device;
   (e) a second clip portion having plural fingers arranged between the first and second power devices and being electrically connected to the active top side of only the second power device; and
   (f) a third clip portion arranged between the first and second power devices and electrically connected to the active top side of the first power device and to the active top side of the second power device.

2. The multi-chip module of claim 1 in which the fingers of the first clip portion and the fingers of the second clip portion are interdigitated.

3. The multi-chip module of claim 1 in which the first and second power devices are lateral power field effect transistors.

4. The multi-chip module of claim 1 in which the first clip portion is-carries a ground voltage.

5. The multi-chip module of claim 1 in which the second clip portion carries a VDD voltage.

6. The multi-chip module of claim 1 in which the third clip portion carries an output signal from between the first and second power devices.

7. The multi-chip module of claim 1 including a control die mounted on the substrate proximate the first power device, the control die including a first connection to a gate terminal of the first power device and a second connection to a gate terminal of the second power device.

8. A multi-chip module comprising:
   (a) a lead frame having a plurality of metal terminals including single terminals and extended terminals, a first die attach area, and a second die attach area;
   (b) a first lateral power field effect transistor having an active top side that includes drain terminals, a gate terminal, and source terminals, the first lateral power field effect transistor having a bottom side, opposite the active top side, mounted on the substrate at the first die attach area;
   (c) a second lateral power field effect transistor having an active top side that includes drain terminals, a gate terminal, and source terminals, the second lateral power field effect transistor having a bottom side opposite the active top side, and the active top side of the second lateral power field effect transistor being arranged facing the active top side of the first lateral power field effect transistor;
   (d) a first dip portion having plural fingers arranged between the active top sides of the first lateral power field effect transistor and the second lateral power field effect transistor, the first clip portion being electrically connected only to the source terminals of the first lateral power field effect transistor and having a portion extending beyond the first lateral power field effect transistor and being connected to a first extended terminal of the lead frame;
   (e) a second clip portion having plural fingers arranged between the active top sides of the first lateral power field effect transistor and the second lateral power field effect transistor, the second clip portion being electrically connected only to the drain terminals of the second lateral power field effect transistor and having a portion extending beyond the second lateral power field effect transistor and being connected to a second extended terminal of the lead frame;
   (f) a third clip portion arranged between the active faces of the first lateral power field effect transistor and the second lateral power field effect transistor, the third second clip portion being electrically connected only to the drain terminals of the first lateral power field effect transistor, being electrically connected only to the source terminals of the second lateral power field effect transistor, and having a portion extending beyond the lateral power field effect transistors and being connected to a terminal of the lead frame;
   (g) a fourth clip portion electrically connected to the gate terminal of the first lateral power field effect transistor;
   (h) a fifth dip portion electrically connected to the gate terminal of the second lateral power field effect transistor; and
   (i) a control die mounted on the second die attach area and having a first electrical connection to the fourth dip portion and a second electrical connection to the fifth clip portion.

9. The multi-chip module of claim 8 in which the first clip portion carries a ground voltage.

10. The multi-chip module of claim 8 in which the second dip portion carries a VDD voltage.

11. The multi-chip module of claim 8 in which the third clip portion carries an output signal.

12. The multi-chip module of claim 8 in which the first clip portion, the second clip portion, the third clip portion, the fourth clip portion, and the fifth clip portion are separate from one another.

13. The multi-chip module of claim 8 in which the fingers of the first clip portion are interdigitated between the fingers of the second clip portion.

* * * * *

UNITED STATES PATENT AND TRADEMARK OFFICE
CERTIFICATE OF CORRECTION

PATENT NO. : 10,128,219 B2
APPLICATION NO. : 13/870770
DATED : November 13, 2018
INVENTOR(S) : Marie Denison et al.

It is certified that error appears in the above-identified patent and that said Letters Patent is hereby corrected as shown below:

In the Claims

Claim 1, Lines 7 & 8:
Please change "clip portion" to instead be "power device".

Signed and Sealed this
Fourteenth Day of April, 2020

Andrei Iancu
*Director of the United States Patent and Trademark Office*